(12) United States Patent
Fotouhi

(10) Patent No.: US 7,109,904 B2
(45) Date of Patent: Sep. 19, 2006

(54) HIGH SPEED DIFFERENTIAL RESISTIVE VOLTAGE DIGITAL-TO-ANALOG CONVERTER

(75) Inventor: Bahram Fotouhi, Cupertino, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 11/021,230

(22) Filed: Dec. 21, 2004

(65) Prior Publication Data

US 2006/0132343 A1    Jun. 22, 2006

(51) Int. Cl.
*H03M 1/66* (2006.01)
(52) U.S. Cl. ..................... 341/144; 341/154
(58) Field of Classification Search ............... 341/144, 341/154, 138, 141
See application file for complete search history.

(56) References Cited

U.S. PATENT DOCUMENTS 5,689,259 A * 11/1997 Ozguc ..................... 341/144
6,778,122 B1 * 8/2004 Lien ........................ 341/154
6,914,547 B1 * 7/2005 Swaroop et al. ............ 341/144
2002/0145552 A1 * 10/2002 Gorman .................... 341/145
2005/0195098 A1 * 9/2005 Panov et al. ............... 341/154

\* cited by examiner

*Primary Examiner*—Peguy JeanPierre
(74) *Attorney, Agent, or Firm*—Townsend and Townsend and Crew LLP

(57) ABSTRACT

A differential digital-to-analog voltage converter (VDAC) includes, in part, a resistor, and at least two decoding stages. The resistor is divided into N equal segments each disposed in a different one of N decoders forming a first decoding stage. The resistor segment in each decoder is further divided into M equal segments to provide M tapped nodes. Each decoder of the first decoding stage delivers two of the M tapped voltages to a pair of associated output nodes, and that are complementary with respect to a voltage present at the center of the resistor segment disposed in that decoder. A second decoding stage receives the first and second voltages delivered by each of the N decoders and delivers two of these voltages, that are complementary with respect to a voltage present at the center of the resistor, to a pair of third and fourth output nodes.

4 Claims, 7 Drawing Sheets

HIGH SPEED DIFFERENTIAL RESISTIVE VOLTAGE DIGITAL-TO-ANALOG CONVERTER

BACKGROUND OF THE INVENTION

A digital-to-analog conversion circuit, also referred to as a DAC, is a decoding device that receives a digitally coded signal and provides corresponding analog output current or voltage signal. Accordingly, a DAC is often used to as an interface between a digital and an analog system.

FIG. 1 is a simplified high-level block diagram of a conventional DAC 10. The input to DAC 10 is a digital word D that includes a stream of binary bits. The output analog signal, which may be a current or a voltage, is related to the input as follows:

$$A = K V_{ref} D$$

where K is a scaling factor, and $V_{ref}$ is a reference voltage. D may be represented as:

$$D = b_1/2^1 + b_2/2^2 + \ldots + b_N/2^N$$

where N is the total number of bits, and $b_1, b_2 \ldots$ are the bit coefficients, quantized to be either a 1 or a 0.

A voltage-scaling DAC, also referred to herein below as VDAC, generates an analog output voltage signal by selectively tapping a voltage-divider resistor string connected between the reference voltage and the ground. A number of switches, e.g., CMOS switches, and/or decoding logic is used to select and pass one of the tapped voltages as the analog output voltage signal. Two conventional decoding methods exist for selecting and passing one of the tapped voltages, namely tree decoding and binary decoding.

FIG. 2 is a schematic diagram of a conventional 3-bit tree decoding VDAC 20 adapted to include, in part, a total of $(2^{3+1}-2=14)$ CMOS transistor switches 41–48, 61–64, 81–82, as well as half as many CMOS inverters 51–54, 71–72 and 81. Resistor 22 is divided into 8 equal resistive segments 22a, 22b, ... 22h. Three decoding stages 40, 60 and 80 are used. Stage 40 receives the eight tapped voltages present on nodes a, b, c, d, ..., h and delivers four of these voltage to the four shown nodes i, j, k, l, in response to bit $b_0$ of the three-bit word $b_2 b_1 b_0$. Stage 60 receives the voltages present on nodes i, j, k, l, and delivers two of these voltages to nodes m, n in response to bit $b_1$ of the three-bit word $b_2 b_1 b_0$. Stage 80 receives the two voltages present on nodes m, n, and delivers one of these voltages as the output voltage to output terminal Vout in response to bit $b_2$ of the three-bit word $b_2 b_1 b_0$. Therefore, depending on the value of the three bits of word $b_2 b_1 b_0$, one of the tapped voltages present on nodes a, b, c ..., h is passed to output terminal Vout.

One disadvantage of tree decoding VDACs, such as VDAC 20, is that the signal path from any one of the tapped voltages to the output terminal includes the junction capacitance and the series on-resistance of the closed transistor switches disposed along the path, as well as the junction capacitance of some of the open transistor switches coupled to that path. For example, the path from tapped node a to terminal Vout includes the junction capacitance and on-resistance of transistor switches 41, 61, 81, as well as junction capacitance of 42 and 62. Accordingly, tree decoding VDACs are typically used in applications where speed of operation is not relatively critical.

FIG. 3 is a schematic diagram of a conventional 3-bit binary decoding VDAC 100 adapted to include, in part, a total of $(2^3=8)$ CMOS transistor switches 91–98. VDAC 100 includes one decoding stage 90 in which 8 switches are disposed. A decoder (not shown) receives the three-bit word $b_2 b_1 b_0$ and generates 8 signals z0, z1, ... z8 that are respectively applied to switches 91–98. Depending on the three bits of word $b_2 b_1 b_0$, one of the eight shown signals z0–z8 is asserted, in order to pass one of the tapped voltages present on nodes a, b, c ..., h to output terminal Vout. Because in such VDACs, one switch is used per tapped node, the signal path from each tapped node to the output terminal sees relatively less resistance. However, such a VDAC requires a relatively large amount of decoding, particularly as the number of bits in word $b_2 b_1 b_0$ increases. Furthermore, neither VDAC 20 nor VDAC 100 is adapted to perform differential digital-to-analog voltage conversion.

BRIEF SUMMARY OF THE INVENTION

In accordance with the present invention, a differential digital-to-analog converter includes, in part, a resistor, and at least two decoding stages. The resistor is divided into N equal segments each disposed in a different one of N decoders forming the first decoding stage. The resistor segment in each decoder is further divided into M equal segments to provide M tapped nodes. Each decoder of the first decoding stage delivers two of the M tapped voltages to a pair of associated output nodes. The two voltages so delivered in each of such decoders are complementary with respect to the voltage present at the center of the resistor segment disposed in that decoder. A second decoding stage receives the first and second voltages delivered by each of the N decoders of the first decoding stage and delivers two of these voltages to a pair of third and fourth output nodes. The voltages delivered to the third and fourth output nodes are complementary with respect to a voltage present at the center of the resistor disposed in the differential digital-to-analog converter. A third decoding stage delivers the voltage of the third node to one of the output terminals of the differential digital-to-analog converter and the voltage of the fourth node to another one of the output terminals of the differential digital-to-analog converter. In embodiments in which N is equal to 1, the output signals of the first decoding stage are delivered directly as input signals to the third decoding stage.

In some embodiments, the decoders disposed in the first decoding stage are adapted to perform binary decoding operations. In other embodiments, the decoders disposed in the first decoding stage are adapted to perform tree decoding operations. In yet other embodiments, the decoders disposed in the first decoding stage are adapted to perform a combination of binary and tree decoding operations.

DETAILED DESCRIPTION OF THE INVENTION

Figure 1:
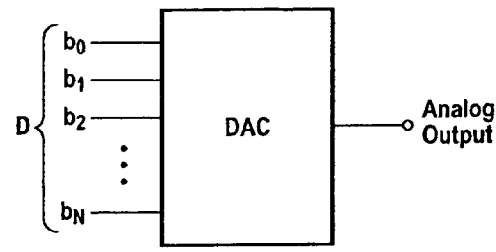
FIG. 1 is a simplified high-level block diagram of a conventional digital-to-analog converter, as known in the prior art.
Figure 2:
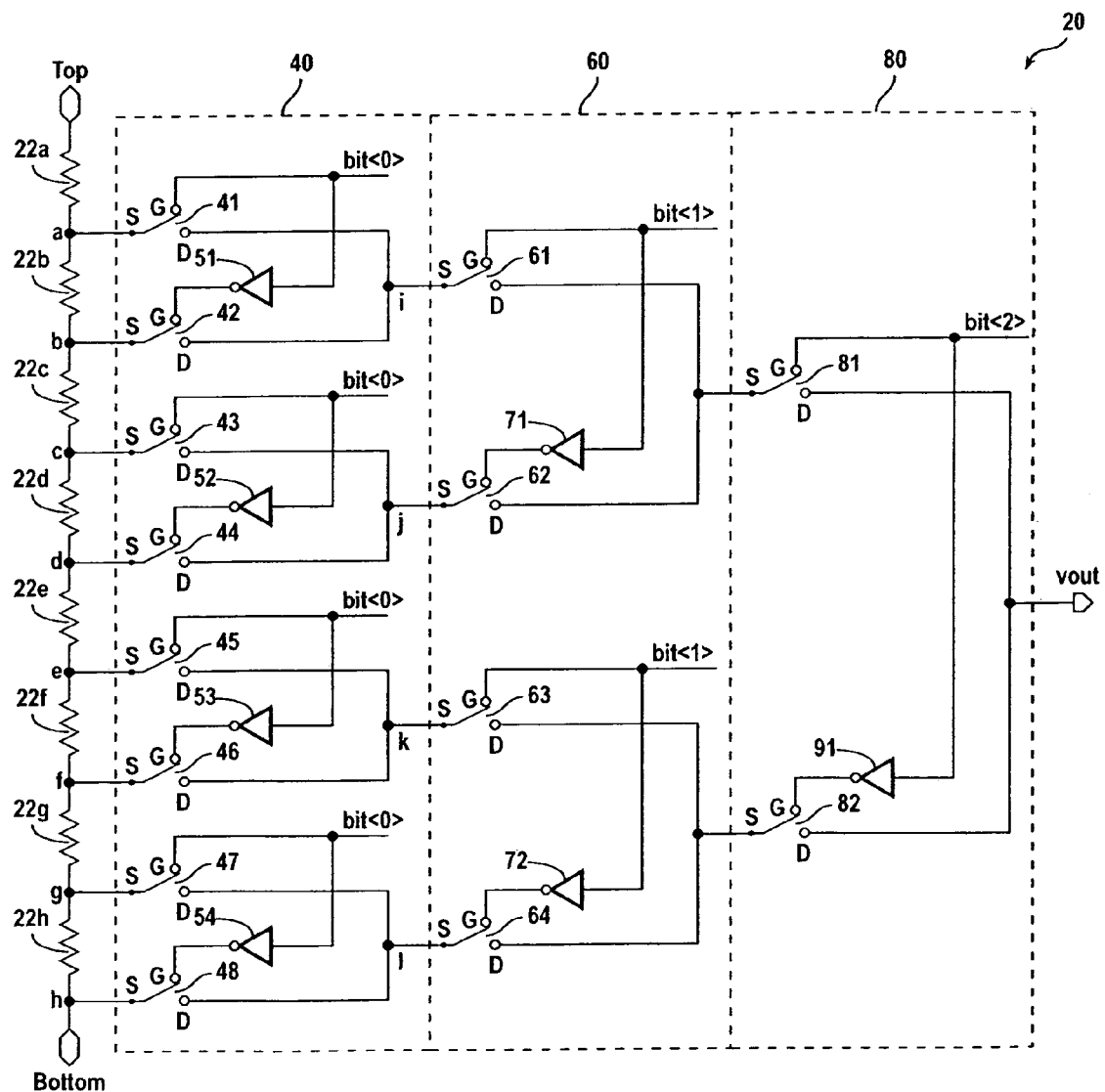
FIG. 2 is a schematic diagram of a conventional 3-bit tree decoding digital-to-analog voltage converter, as known in the prior art.
Figure 3:
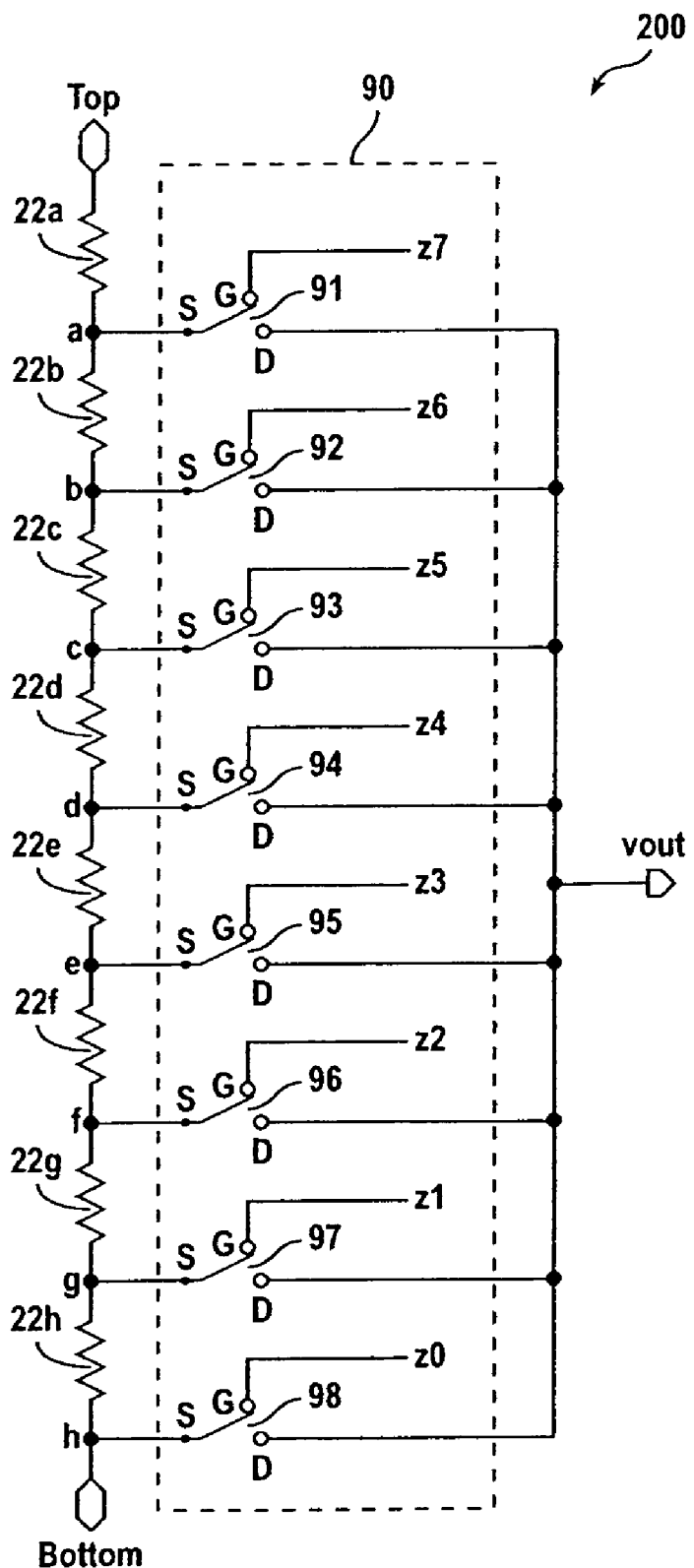
FIG. 3 is a schematic diagram of a conventional 3-bit binary decoding digital-to-analog voltage converter, as known in the prior art.
Figure 4:
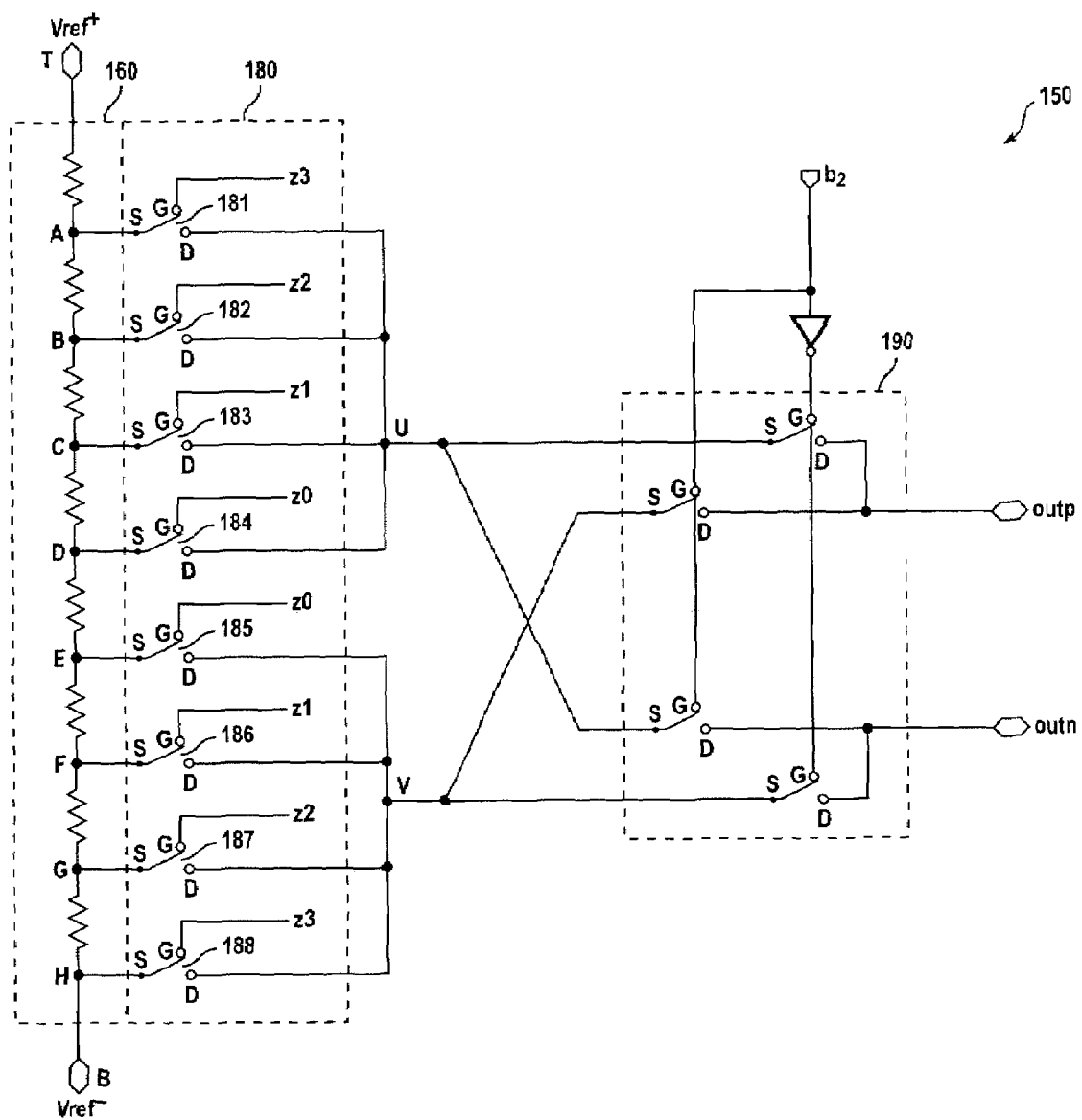
FIG. 4 is a schematic diagram of a 3-bit differential digital-to-analog voltage converter, in accordance with one embodiment of the present invention.

FIG. 4 is a schematic diagram of a 3-bit differential digital-to-analog voltage converter (VDAC) 150, in accordance with one embodiment of the present invention. VDAC 150 is adapted to include, in part, resistor 160, first decoding stage 180, and second decoding stage 190. Resistor 160 is divided into 8 equal segments and is tapped at nodes A, B, C, D, E, F, and G. Node T of resistor 160 is coupled to the positive voltage supply Vref$^+$, and node B of resistor 160 is coupled to the negative supply voltage Vref$^-$.

Decoding stage 180 receives the tapped voltages at the above 7 nodes, and delivers a pair of voltages at nodes U and V that are complementary with respect to the center tapped node D of resistor 160. Decoding stage 180 is adapted to include 8 transistor switches that receive one of the decoded signals Z0, Z1, Z2, and Z3. A two-to-four bit decoder (not shown), receives the two least significant bits $b_0$ and $b_1$ of the digital word $b_2b_1b_0$, and generates the four decoded signals Z0–Z3. Signal Z0 is applied to switches 184, 185; signal Z1 is applied to switches 183, 186; signal Z2 is applied to switches 182, 187; and signal Z3 is applied to switches 181, 188.

As described above, in accordance with the present invention, the voltages that are delivered by decoding stage 180 to nodes U and V are complementary with respect to the center tapped node D of resistor 160. For example, if signal Z3 is asserted, the voltages at nodes A and G, which are complementary with respect to the voltage at the center tapped node D, are delivered respectively to nodes U and V. Similarly, if, for example, signal Z2 is asserted, the voltages at nodes B and F, which are complementary with respect to the voltage at the center tapped node D, are respectively delivered to nodes U and V. In other words, the first decoding stage of a VDAC, in accordance with the present invention, generates a pair of signals that are complementary with respect to the voltage at the center of the divided resistor disposed in the VDAC.

For example, assume that the voltages applied to nodes T and B of resistor 160 are respectively at 2 and 0 volts. Therefore, the voltage at node D is 1 volt. If signal Z3 is asserted, the voltages at nodes A and G, which are respectively at 1.75 and 0.25 volts, are delivered respectively to nodes U and V. Similarly, if, for example, signal Z2 is asserted, the voltages at nodes B and F, which are respectively at 1.5 and 0.5 volts, are delivered respectively to nodes U and V. In other words, the voltages delivered respectively to nodes U and V are always complementary with respect to the voltage at the center node of resistor 160.

As seen from FIG. 4, second decoding stage 190 receives the voltages at nodes U and V, and depending on the value of bit $b_2$ either delivers these voltages respectively to output terminals Outp, Outn, or respectively to output terminals Outn, Outp. If, bit $b_2$ is, e.g. a 1, the voltage at node U is supplied to output terminal Outn, and the voltage at node V is supplied to output terminal Outp. If, on the other hand, bit $b_2$ is, e.g. a 0, the voltage at node U is supplied to output terminal Outp, and the voltage at node V is supplied to output terminal Outn.

Figure 5:
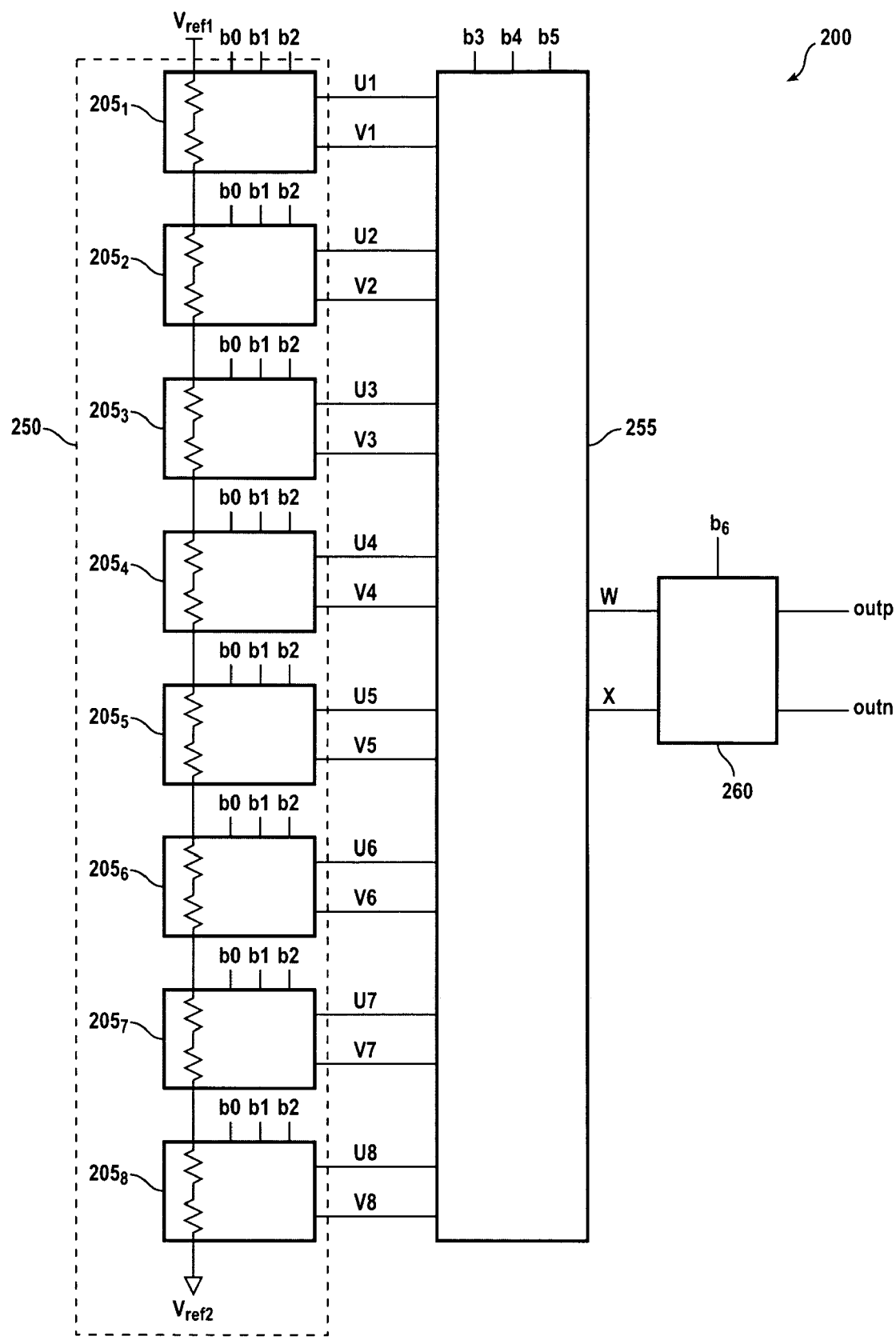
FIG. 5 is a high-level block diagram of a 7-bit differential digital-to-analog voltage converter, in accordance with another embodiment of the present invention.

FIG. 5 is a high-level block diagram of a 7-bit differential digital-to-analog voltage converter (VDAC) 200, in accordance with another embodiment of the present invention. VDAC 200 includes, in part, a resistor, a first decoding stage 250, a second decoding stage 255, and a third decoding stage 260. The resistor is disposed in first decoding stage 250 and is coupled between the positive reference voltage Vref1, and the negative reference voltage Vref2.

First decoding stage 250 is shown as including 8 decoders 205$_1$, 205$_2$, 205$_3$, 205$_4$, 205$_5$, 205$_6$, 205$_7$, 205$_8$. Each decoder 205 has disposed therein an equal segment, i.e., one-eight, of the resistor. The resistor segment in each of these decoders is further divided into sixteen equal parts, thereby providing sixteen nodes that are tapped by that decoder. Each of these decoders is further adapted to receive three bits $b_2b_1b_0$ of the 7-bit word and supply two voltage signals that are complementary with respect to the voltage at center of the resistor segment disposed therein. Accordingly, eight such differential signal pairs are supplied by decoding stage 250, and that are received by second decoding stage 255.

Decoding stage 255 receives the three bits $b_5b_4b_3$ of the 7-bit word and, in response, delivers to an output node a first signal from one of the four pairs $U_i$, $V_i$, and delivers to another output node a second signal from the other of the four eight pairs $U_{9-i}$, $V_{9-i}$, where in this embodiment i is an integer varying from 1 to 4. The first and second signals so delivered by decoding stage 255 are complementary with respect to the voltage at the center of the resistor R disposed in the first decoding stage 250. Therefore, because signals $U_i$ and $V_{9-i}$ are complementary with respect to the voltage at the center of the resistor R, decoding stage 255 is adapted to deliver these two signals to nodes W and X in response to some values of bits $b_5b_4b_3$. Similarly, because signals $V_i$ and $U_{9-i}$ are complementary with respect to the voltage at the center of the resistor R, decoding stage 255 is adapted to deliver these two signals to nodes W and X in response to some other values of bits $b_5b_4b_3$. Such first and second voltage signals include, for example, signals ($U_1$, $V_8$) ($V_1$, $U_8$), ($U_3$, $V_5$), ($V_4$, $U_5$), etc.

Figure 6:
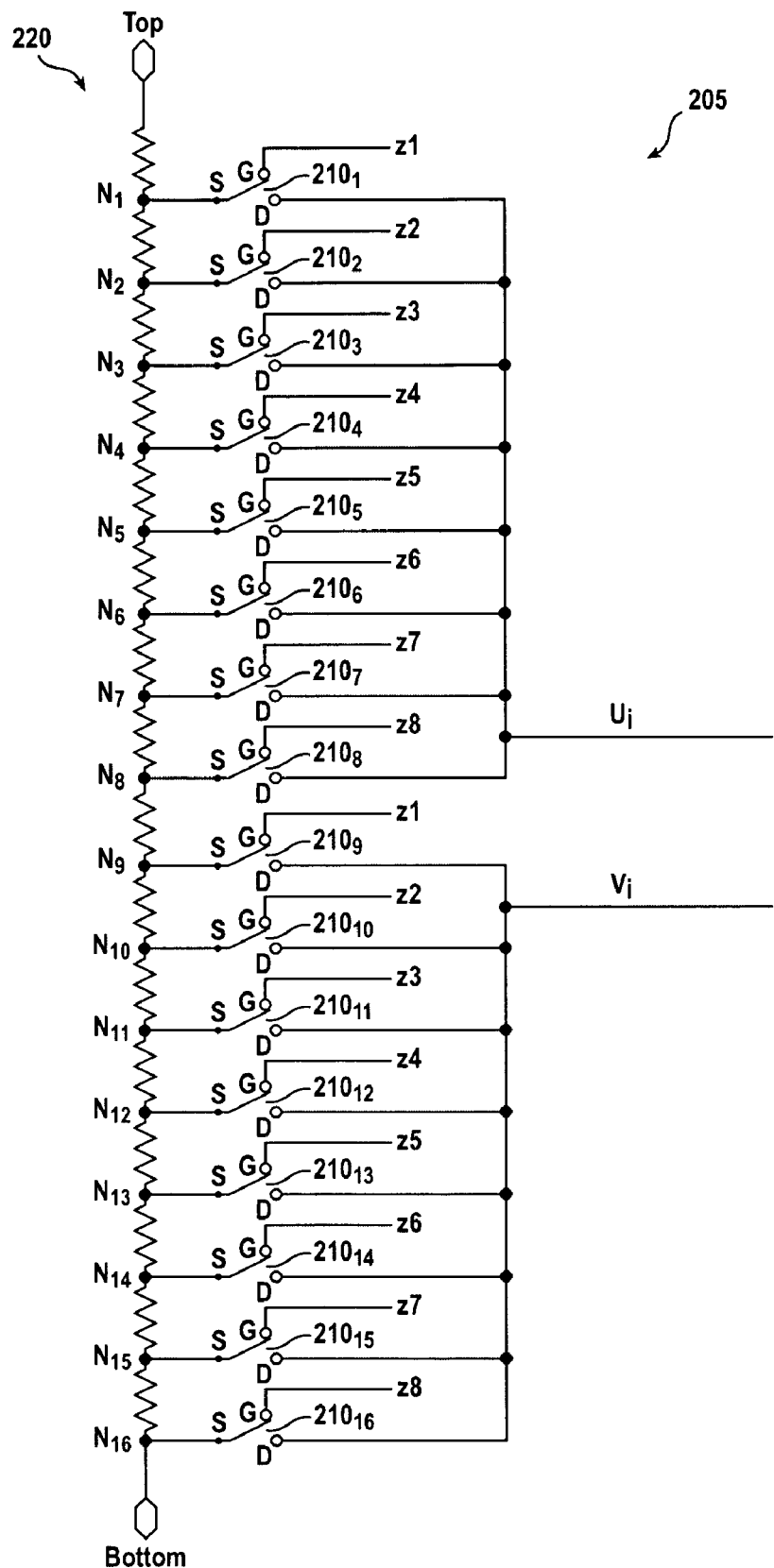
FIG. 6 is a schematic diagram of each of the decoders disposed in the first decoding stage of the differential digital-to-analog voltage converter of FIG. 5, in accordance with one embodiment.

FIG. 6 provides a more detailed view of each of decoders 205. Resistor segment 220—which has a resistance of R/8—disposed in each decoder 205 is divided into 16 equal parts (i.e., R/128) to provide 16 tapped nodes $N_j$, where j is an integer varying 1 to 16. These 16 tapped nodes provide 8 pairs of voltage signals that are complementary with respect to the voltage at the center of the R/8 resistor disposed in decoder 205. In other words, the voltage at node $N_j$ is complementary with respect to the voltage at node $N_{17-j}$. For example, the voltage at node $N_1$ is complementary with respect to the voltage at node $N_{16}$ Similarly, the voltage at node $N_3$ is complementary with respect to the voltage at node $N_{14}$. Each decoder 205 is adapted to deliver a pair of such complementary tapped voltages from nodes $N_j$ and $N_{17-j}$ as output voltages to nodes U and V.

In the embodiment shown in FIG. 6, the selection and delivery of the tapped resistor voltages to output nodes is performed using a binary encoder, which includes 16 CMOS switches $210_j$. A logic decoder (not shown) receives bits $b_2b_1b_0$ and, in response, generates 8 decoded signals $Z_k$, where k is equal to j when j varies between 1 and 8, and k is equal to (j−8) when k varies between 9 and 16. Decoded signal $Z_k$ is applied to switch $210_j$. Accordingly, when the voltage at tapped node $N_1$ is delivered to output node U, the voltage at tapped node $N_{1+8}$ is delivered to output node V, where l is integer varying from 1 to 8. As is seen from FIG. 6 and described above, the voltages delivered to output nodes U and V are complementary with respect to the voltage at the center of resistor 220 disposed in each decoder 205. It is understood that each decoder 205 may be adapted to perform tree decoding, or a combination of tree decoding and binary decoding to generate the voltages delivered to nodes U, V.

The eight pairs of complementary voltage signals present on nodes $U_i$, $V_i$ supplied by decoders 205 are delivered to decoding stage 255. As described above, in response to bits $b_5b_4b_3$, decoding stage 255 delivers one of the signals from the four pair of signals present on nodes $U_i$, $V_i$, and another signal from the four pair of signals present on nodes $U_{9-i}$, $V_{9-i}$ to its output nodes W and X. The two voltage signals so delivered by decoding stage 255 to its output nodes are complementary with respect to the voltage at the center of the resistor R disposed in VDAC 200. Therefore, because signals $U_i$ and $V_{9-i}$ are complementary with respect to the voltage at the center of the resistor R, decoding stage 255 is adapted to deliver these two signals to nodes W and X in response to some values of bits $b_5b_4b_3$. Similarly, because signals $V_i$ and $U_{9-i}$ are complementary with respect to the voltage at the center of the resistor R, decoding stage 255 is adapted to deliver these two signals to nodes W and X in response to some other values of bits $b_5b_4b_3$. It is understood that decoding stage 255 may use a binary decoder, a tree decoder, or a combination of binary and tree decoders to deliver the voltages to its output nodes W and X in response to bits $b_5b_4b_3$.

Figure 7:
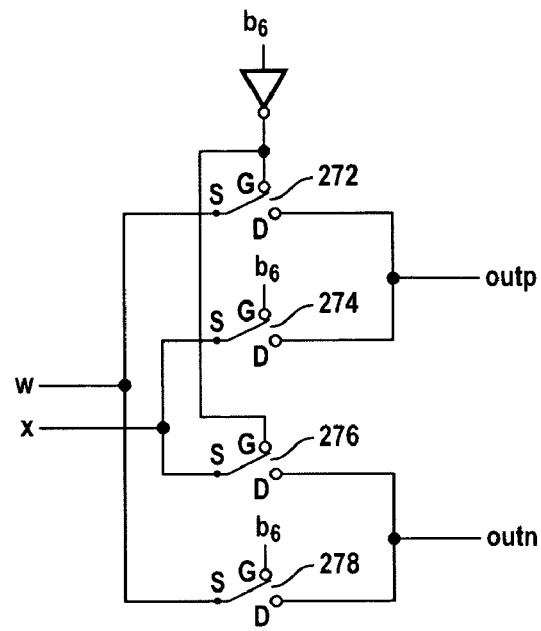
FIG. 7 is a schematic diagram of the third decoding stage of the differential digital-to-analog voltage converter of FIG. 5, in accordance with one embodiment.

Decoding stage 260 receives the complementary voltages on nodes W, X and delivers one of these voltages to output terminal Outp, and the other one of these voltages to output terminal Outn in response to bit $b_6$. FIG. 7 provides a more detailed view of each of decoder 260, in accordance with one embodiment. If bit $b_6$ is a 1, switches 274 and 278 are closed, thus the voltage received from terminal W is delivered to terminal Outn and the voltage received from terminal X is delivered to terminal Outp. If bit $b_6$ is a 0, switches 272 and 276 are closed, thus the voltage received from terminal X is delivered to terminal Outn and the voltage received from terminal W is delivered to terminal Outp.

Figure 8:
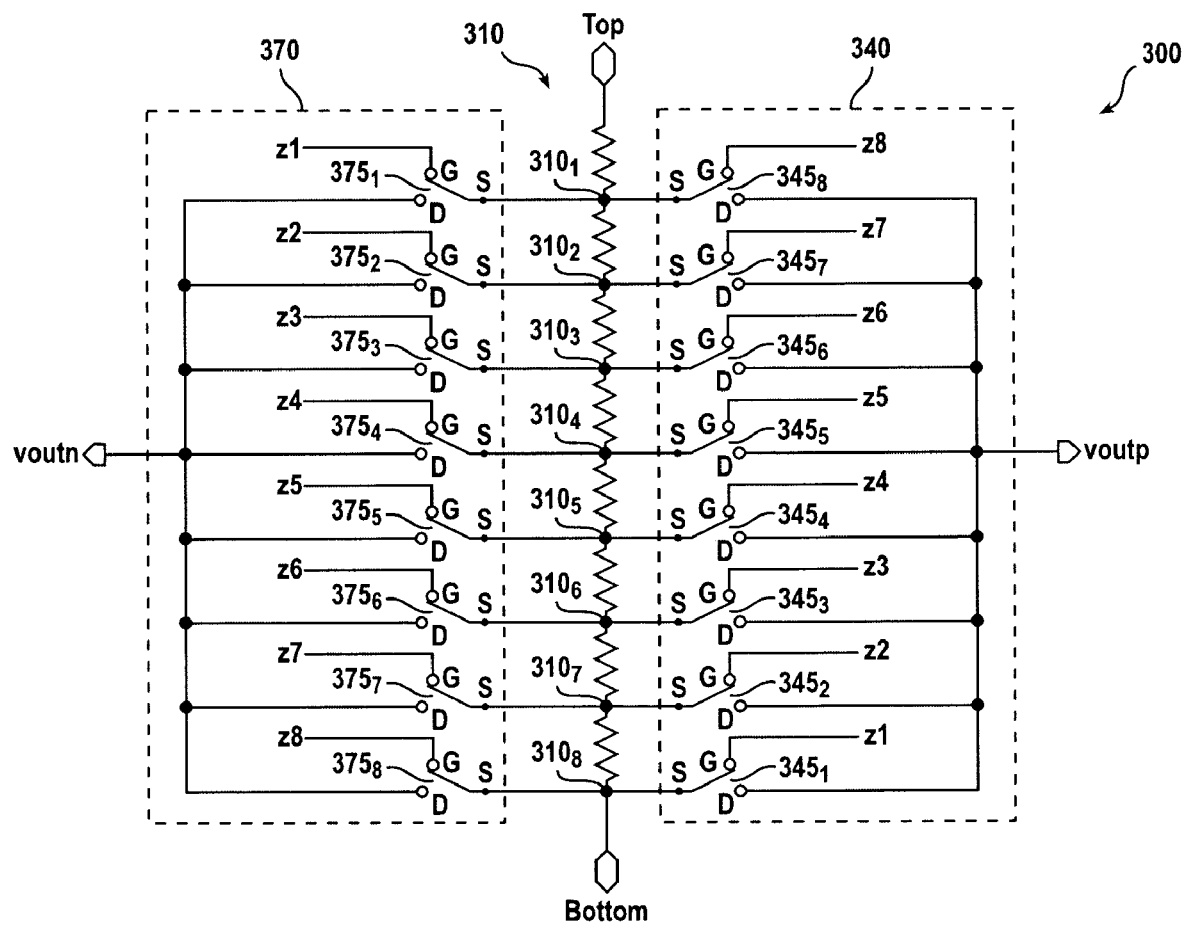
FIG. 8 is a schematic diagram of a 3-bit differential digital-to-analog voltage converter, in accordance with another embodiment of the present invention.

FIG. 8 is a schematic diagram of a 3-bit differential VDAC 300, in accordance with another embodiment of the present invention. VDAC 300 is adapted to include, in part, resistor 310, and a pair of binary decoding stages 340 and 370. Resistor 310 is divided into 8 equal segments to provide 8 tapped nodes $310_i$, where in this embodiment i is an integer variable ranging from 1 to 8. A decoding logic (not shown) receives bits $b_2b_1b_0$ and generates decoded signals $Z_i$ that are delivered to both decoding stages 340, and 370.

Each of these decoding stages includes 8 switches, each adapted to receive a different one of the decoded signals $Z_i$ such that the voltages delivered to terminals Outp and Outn are complementary with respect to the voltage at the center node $310_4$ of resistor 310. Decoding stage 340 is shown as having disposed therein 8 switches $345_i$, with switch $345_i$ adapted to receive decoded signal $Z_i$. Similarly, decoding stage 370 is shown as having disposed therein 8 switches $375_i$, with switch $375_i$ adapted to receive decoded signal $Z_i$. Accordingly, for each decoded signal $Z_i$, the voltage at node $310_{(9-i)}$ is delivered to terminal Outp via switch $345_i$ and is delivered to terminal Outn via switch $375_i$.

Figure 9:
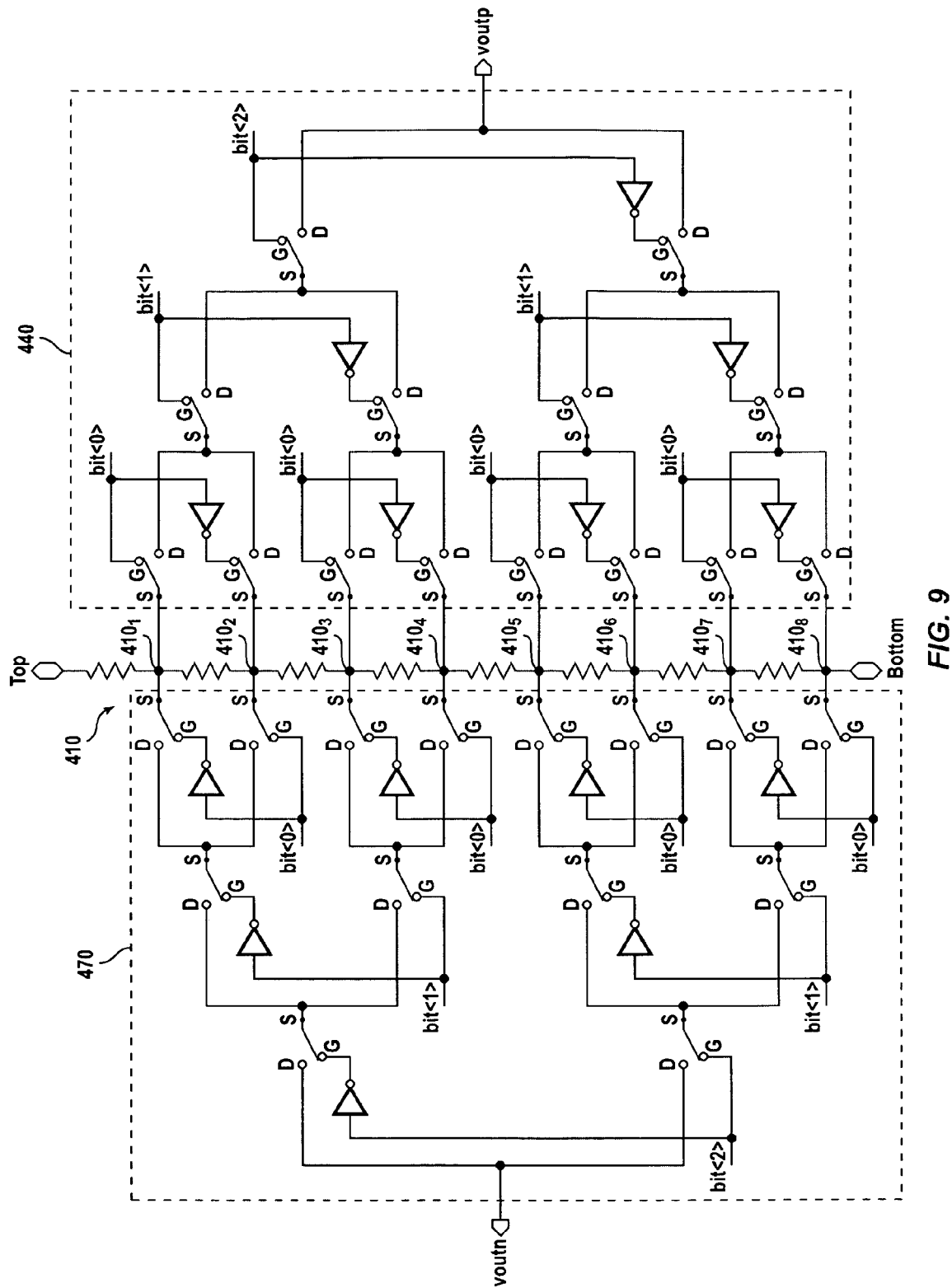
FIG. 9 is a schematic diagram of a 3-bit differential digital-to-analog voltage converter, in accordance with yet another embodiment of the present invention.

FIG. 9 is a schematic diagram of a 3-bit differential VDAC 400, in accordance with another embodiment of the present invention. VDAC 400 is adapted to include, in part resistor 410, and a pair of tree decoding stages 440 and 470. Resistor 410 is divided into 8 equal segments to provide 8 tapped nodes $410_i$, where in this embodiment i is an integer variable ranging from 1 to 8.

Tree decoding stage 440 includes 14 switches and is adapted to deliver to terminal Outp one of the tapped resistor 410 voltages. Similarly, tree decoding stage 470 includes 14 switches and is adapted to deliver to terminal Outn another one of the tapped resistor 410 voltages. The voltages so delivered to output terminals Outp and Outn are complementary with respect to the voltage at the center node $410_4$ of resistor 410. Therefore, if for example, the voltage at node $410_1$ of resistor 410 is delivered to output terminal Outp, the voltage at node $410_7$ of resistor 410 is delivered to output terminal Outn. Similarly, if, if for example, the voltage at node $410_4$ of resistor 410 is delivered to output terminal Outp, the voltage at node $410_5$ of resistor 410 is delivered to output terminal Outn.

The above embodiments of the present invention are illustrative and not limiting. Various alternatives and equivalents are possible. The invention is not limited by the type of switches, CMOS or otherwise which may be used in the differential digital-to-analog voltage conversion circuitry of the present invention. The invention is not limited by the type of decoding logic that receives the digital word and generates the decoded signals. The invention is not limited by the type of integrated circuit in which the present invention may be disposed. Nor is the invention limited to any specific type of process technology, e.g., CMOS, Bipolar, or BICMOS that may be used to manufacture the present invention. Other additions, subtractions or modifications are obvious in view of the present invention and are intended to fall within the scope of the appended claims.

What is claimed is:

1. A differential digital-to-analog converter comprising:
    a decoding stage comprising N decoders, wherein each decoder is adapted to receive M voltages associated with M tapped nodes of a different one of N equal segments of a resistor; each decoder further adapted to deliver a first and a second of the received M voltages to a pair of associated first and second nodes, wherein the first and the second delivered voltages in each of the N decoders are complementary with respect to a voltage present at the center of the resistor segment disposed in that decoder;
    a second decoding stage adapted to receive the N first voltages and the N second voltages and to deliver one of the N first voltages as a third voltage and one the N second voltages as a fourth voltage to a pair of third and fourth output nodes, wherein the third and fourth voltages are complementary with respect to a voltage present at the center of the resistor; and
    a third decoding stage adapted to deliver one of the third and fourth voltages to a first output terminal of the digital-to-analog converter, and deliver the other one of the third and fourth voltages to a second output terminal of the digital-to-analog converter.

2. The differential digital-to-analog converter of claim 1 wherein each decoder of said first decoding stage is adapted to perform a binary decoding operation.

3. The differential digital-to-analog converter of claim 1 wherein each decoder of said first decoding stage is adapted to perform a tree decoding operation.

4. The differential digital-to-analog converter of claim 1 wherein each decoder of said first decoding stage to perform both binary and tree decoding operations.

* * * * *